(12) United States Patent
Corsi et al.

(10) Patent No.: US 6,304,143 B1
(45) Date of Patent: Oct. 16, 2001

(54) AMPLIFIER SLEW RATE BOOSTING SCHEME

(75) Inventors: Marco Corsi, Parker; Kenneth G. Maclean, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/711,775

(22) Filed: Nov. 13, 2000

(51) Int. Cl.$^7$ .................................................. H03F 3/45
(52) U.S. Cl. ................................. 330/255; 330/292
(58) Field of Search ............................. 330/255, 292

(56) References Cited

U.S. PATENT DOCUMENTS

| | | | |
|---|---|---|---|
| 4,267,519 | * 5/1981 | Schade, Jr. | 330/255 |
| 6,084,475 | * 7/2000 | Rincon-Mora | 330/255 |
| 6,107,883 | * 8/2000 | Xu | 330/253 |
| 6,137,363 | * 10/2000 | Miki et al. | 330/255 |

OTHER PUBLICATIONS

Andersen, (1997) "Kinase Cascades Regulating Entry into Apoptosis." *Microbiol. Mol. Bio. Rev.,*, vol. 61(1):33–46.
Berk et al., (1197) "Angiotensin II Signal Transduction in Vascular Smooth Muscle." *Circ. Res.*, vol. 80(5):607–616.
Blum et al. (1987) "Improved silver staining of plant proteins, RNA and DNA in polyacrylamide gels." *Electrophoresis*, vol. 8:93–99.
Dirks et al. (1997) "Current Concepts in Neuro–Oncology: The Cell Cycle—A Review." *Neurosurgery*, vol. 40(5):1000–1015.
Gauss et al. (1999) "Analysis of the mouse proteome. (I) Brain proteins: Separation by two–dimensional electrophoresis and identification by mass spectrometry and genetic variation." *Electrophoresis*, vol. 20(3):575–600.
Imahori et al. (1997) "Physiology and Pathology of Tau Protein Kinases in relation to Alzheimer's Disease." *J. Biochem.*, vol. 121:179–188.
Laird et al. (1997) "Oncoprotein Signalling and Mitosis." *Cell Signal*, vol. 9(3/4):249–255.
Michell et al. (1996) "Isoform–specific Purification and Substrate Specificity of the 5'–AMP—activated Protein Kinase." *J. Biol. Chem.*, vol. 271:28445–28450.
Mufson (1997) "The role of serine/threonine phosphorylation in hematopoietic cytokine receptor signal transduction." *FASEB J.*, vol. 11:37–44.
Shevchenko et al. (1996) "Mass Spectrometric Sequencing of Proteins from Silver–Stained Polyacrylamide Gels." *Analytical Chemistry*, vol. 68:850–858.
Woodgett (1991) "Use of Synthetic peptides Mimicking Phosphorylation Sites for Affinity Purification of Protein-Serine Kinases." *Meth. in Enzymol.*, vol. 200:169–178.

\* cited by examiner

*Primary Examiner*—Robert Pascal
*Assistant Examiner*—Henry Choe
(74) *Attorney, Agent, or Firm*—Dwight N. Holmbo; Wade James Brady, III; Frederick J. Telecky, Jr.

(57) ABSTRACT

An amplifier slew rate boosting scheme for use with an amplifier having a closed-loop gain equal to or very near unity has one plate of a compensation capacitor conventionally coupled to an internal high impedance gain node, but has the other plate of the compensation capacitor unconventionally driven with a buffered version of the input signal. The voltage appearing across the compensation capacitor in response to changes in the input signal is significantly less than that achieved using conventional compensation architectures where the other plate of the compensation capacitor is coupled to an AC ground. Since very little current is required to charge the compensation capacitor, the tail current generated by the input stage can be used instead to charge parasitic capacitances within the amplifier to increase the slew rate.

9 Claims, 2 Drawing Sheets

AMPLIFIER SLEW RATE BOOSTING SCHEME

BACKGROUND OF THE INVENTION

1. Field of the Invention

This invention relates generally to operational amplifier (op-amp) slew rate boosting schemes, and more particularly to a technique to boost the slew rate of an op-amp which has a closed-loop gain that is equal to or very close to unity.

2. Description of the Prior Art

Folded cascode op-amps having a class 'AB' buffer output stage and a closed-loop gain that is equal to or very close to unity are well known in the prior art. One such op-amp 100 is illustrated in FIG. 1. The folded cascode op-amp 100 can be seen to have a class 'AB' buffer 102 at its output. The equations which govern the operation of the op-amp 100 are also very well known and have been documented by Paul R. Gray and Robert G. Mayer in *Analysis and Design of Analog Integrated Circuits*, pp. 646–onward, John Wiley & Sons, Inc., 3$^{rd}$ Edition. It has been shown that if the op-amp 100 is to be made stable, one must control its unity gain crossing frequency. The conventional technique for controlling this unity gain crossing frequency is to couple a compensation capacitor 104 between a high impedance node 106 of the output buffer 102 and an AC ground 108. The frequency where the open loop gain falls to unity for op-amp 100 is then defined as:

$$f_{unity} = \frac{G_m}{C_{comp}} \quad (1)$$

where $G_m$ is the transconductance of the input stage 110 and is determined by the tail current $I_{tail}$ shared by the input stage 110 transistors. Specifically, $G_m$ is defined as:

$$G_m = \frac{qI_{tail}}{kT} \quad (2)$$

The slew rate (maximum rate of change in output voltage for large input signals) for op-amp 100 is defined as:

$$\text{Slewrate} = \frac{I_{tail}}{C_{comp}} \quad (3)$$

where it is well known the compensation capacitor $C_{comp}$ 104 must be set to a sufficiently large value in order to make the op-amp 100 stable. If more than two poles exist before the unity gain frequency $f_{unity}$ is reached, the op-amp 100 will be unstable. Specifically, the compensation capacitor $C_{comp}$ 104 operates to push the first dominant pole down to a low enough frequency such that the op-amp 100 gain falls below unity before the second pole is reached. Setting the value of compensation capacitor $C_{comp}$ 104 to achieve the above desired stability characteristics therefore also establishes the maximum slew rate for the op-amp 100 as set forth in equation (3) above. It is, of course, desirable to have a very high slew rate. In view of the foregoing, it can be appreciated that achieving a very high slew rate requires reducing the value of the compensation capacitor $C_{comp}$ 104. Reducing the value of the compensation capacitor $C_{comp}$ 104 however, makes the op-amp 100 less stable since the first dominant pole will then be moved to a higher frequency as discussed herein before. The desired value of the compensation capacitor $C_{comp}$ 104 and the desired high slew rate are therefore in direct conflict with one another.

One conventional technique used to address the direct conflict between the desired value of the compensation capacitor $C_{comp}$ 104 and the desired high slew rate includes reducing the value of transconductance $G_m$ associated with the input stage 110 be inserting resistors into the emitter paths of the input stage 110 transistors. A lower value for the compensation capacitor $C_{comp}$ 104 can then be used to achieve amplifier stability as seen by equation (1) above, which also then increases the slew rate as seen by equation (3) above. This technique however, is problematic in that the emitter resistors added to the emitter paths of the input stage 110 transistors introduce additional noise that cannot be tolerated in specific applications such as illustrated in FIG. 2 that simply illustrates unity gain op-amp 100 driving a load 102 that is connected to ground in response to an input signal such as might be used to accommodate ADSL systems.

In view of the foregoing, a need exists for a technique to boost the slew rate of amplifiers having a closed-loop gain at or very near to unity without introducing additional noise into the system.

SUMMARY OF THE INVENTION

To meet the above and other objectives, the present invention provides a technique to increase the slew rate of a unity gain operational amplifier (op-amp) beyond that achievable using conventional techniques known in the art. According to one embodiment, an input signal is applied to the input of a unity gain buffer as well as the input of the input stage of the amplifier. The end of the compensation capacitor that is typically coupled to an AC ground is now coupled instead to the output of the unity gain buffer. The slew rate of the op-amp remains as defined by equation (3) above; however since the signal across the compensation capacitor is now much smaller, the slew rate of the op-amp is much higher.

Conventional op-amp compensation techniques provide a high small signal open loop voltage gain at a high output impedance at the op-amp gain node. This high output impedance in combination with the compensation capacitor then operates to place the dominant pole. When a conventional op-amp uses a compensation capacitor to achieve stability, all of the input stage tail current will flow into the compensation capacitor in response to a large step input voltage since one end of the compensation capacitor is coupled to the high impedance gain node while the opposite end of the compensation capacitor is coupled to an AC ground. The tail current will charge the compensation capacitor to achieve a slew rate defined by equation (3) above.

The structure described above in association with the present invention results in both ends of the compensation capacitor being driven by approximately the same voltage. Since approximately the same voltage is driving both ends of the compensation capacitor, the tail current will no longer flow substantially into the compensation capacitor. In other words, because the voltage appearing across the compensation capacitor is now very small, very little current is necessary to charge the compensation capacitor. The slew rate is therefore increased (without sacrificing noise performance by decreasing transconductance of the input stage) since the tail current is now available instead to charge up all of the parasitic capacitance within the op-amp (e.g. input capacitance of output stage, collector capacitance seen at node common to collectors of output stage PNP and NPN transistors).

In one aspect of the invention, a slew rate boosting technique increases the slew rate for amplifiers having a closed-loop gain equal to or very near unity.

In another aspect of the invention, a slew rate boosting technique increases the slew rate for amplifier having a closed-loop gain equal to or very near unity without noise degradation of the amplifier.

In yet another aspect of the invention, a slew rate boosting technique increases the slew rate for amplifiers having a closed-loop gain equal to or very near unity without sacrificing amplifier stability.

BRIEF DESCRIPTION OF THE INVENTION

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE INVENTION

Figure 1:
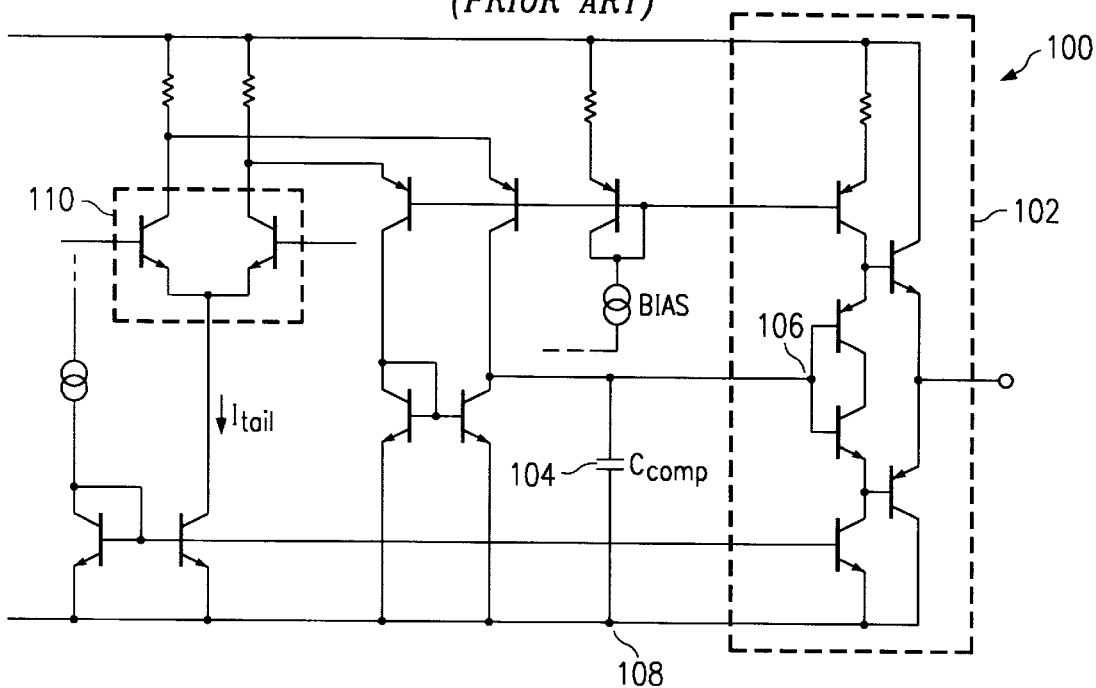
FIG. 1 is a schematic diagram illustrating a conventional folded cascode op-amp having a class 'AB' buffer output stage and that is known in the prior art.
Figure 2:
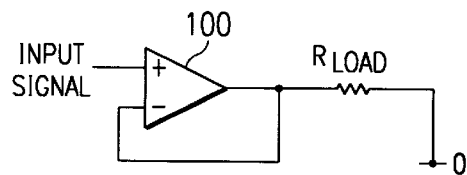
FIG. 2 is a schematic diagram illustrating a typical application of the folded cascode op-amp depicted in FIG. 1.

Looking now at FIG. 1, a simplified schematic diagram illustrates a voltage mode operational amplifier 100 suitable for unity gain applications. The slew rate of a voltage mode amplifier 100 such as shown in FIG. 1 is generally limited by the input transconductance $G_m$ and the size of the compensation capacitor 104, as stated herein before. The operation of amplifier 100 is governed by equations (1)–(3). The compensation capacitor 104, as also stated above, is chosen so that the unity gain bandwidth of the amplifier 100 is low enough so that the amplifier 100 does not oscillate when in closed loop. To increase the slew rate therefore, one needs to decrease the value of the compensation capacitor 104. One method of increasing slew rate is reducing the input transconductance $G_m$ by resistive degeneration. This allows one to decrease the value of input transconductance $G_m$ while keeping the slewing current ($I_{tail}$) constant. This solution, while allowing much higher slew rates than that which can be obtained by typical methods, is problematic in that it introduces noise into the system.

Figure 3:
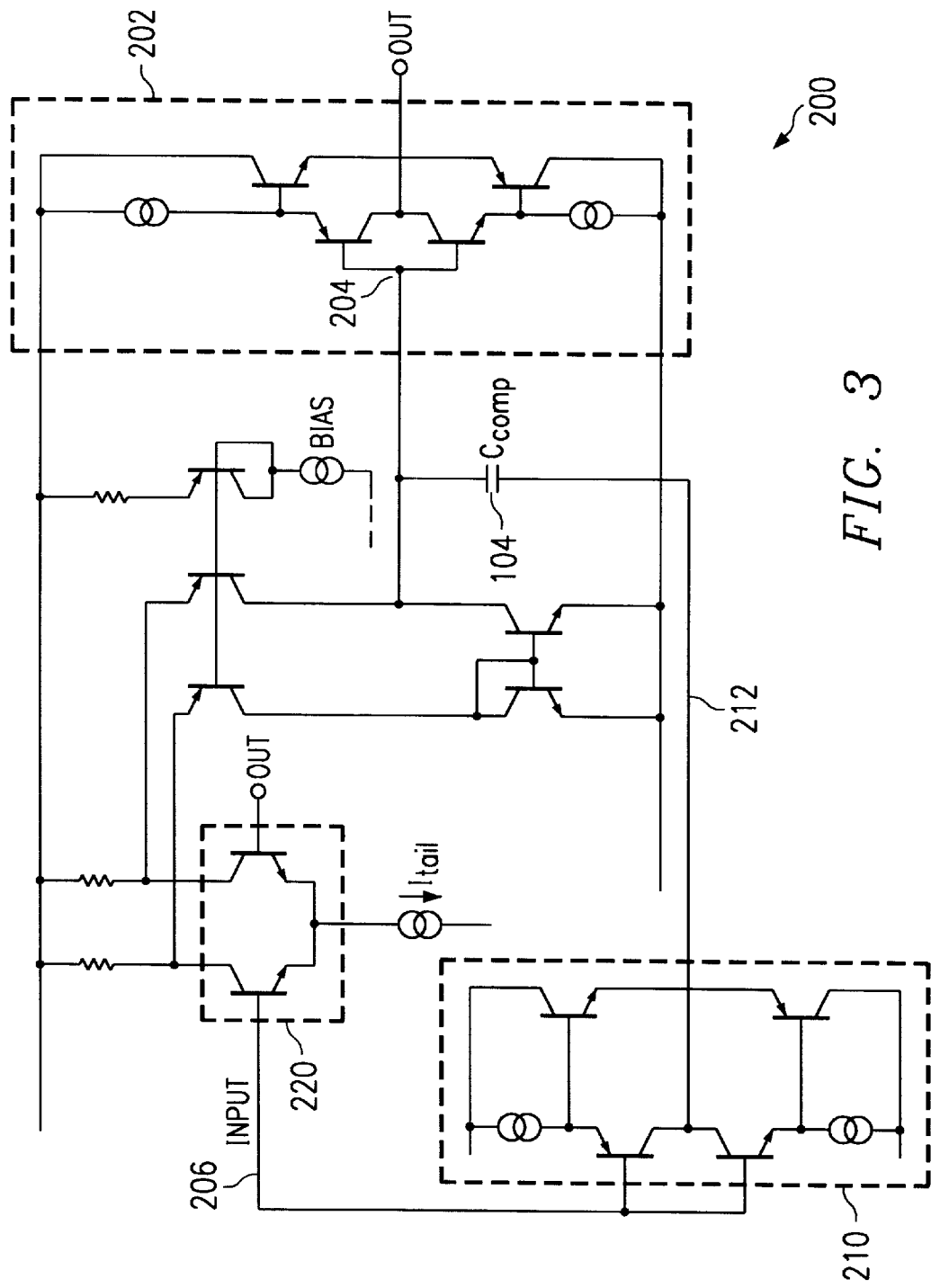
FIG. 3 is a schematic diagram illustrating a slew rate boosted unity gain amplifier according to one embodiment of the present invention.

Moving now to FIG. 3, a simplified schematic diagram illustrates a slew rate boosted amplifier 200 suitable for unity gain applications according to one embodiment of the present invention. In an application where the closed-loop gain of the amplifier 200 is close to unity and the amplifier 200 is of the type where a transconductance $G_m$ is routed into a compensation capacitor 104 followed by a unity gain output stage 202, the voltage at the input 204 to the output stage 202 is similar in magnitude to the input signal 206. The unity gain output stage 202 can be seen to be a class 'AB' buffer amplifier. The nature of the present invention is to drive both ends of the compensation capacitor 104 with a nearly identical signal. Specifically, one end of the compensation capacitor 104 is coupled to the input node 204 of the output stage 202 while the opposite end of the compensation capacitor 104 is driven with a buffered version of the input signal 206. The input voltage signal 206 which is applied to the amplifier 200 input, is also applied to a voltage (buffer) amplifier 210 that has a gain of +1 such that the input voltage signal 206 also appears at the output 212 of the buffer amplifier 210. The buffer amplifier 210 can also be seen to be implemented as a class 'AB' buffer amplifier. The voltage signal across the compensation capacitor 104 is now only the voltage difference in the signal at the gain node 204 and the signal appearing at the output 212 of the buffer amplifier 210. The present inventors found this difference voltage could be on the order of 100 times less than the signal 206 present on the input to the amplifier 200. The current flowing from the input stage 220 is therefore not the limiting factor in the slew rate of the amplifier 200, and is now available instead to drive the parasitic capacitances within the amplifier 200.

From a small signal stability point of view, the amplifier 200 is very similar to amplifier 100 shown in FIG. 1. The input stage 220, for example, still needs to charge and discharge the compensation capacitor 104, but now with a much reduced slewing requirement. The compensation capacitor 104 is therefore no longer the limiting factor regarding amplifier slew rate. In fact, it feeds the signal forward of its input; and the output stage 202 need only linearize any remaining errors (voltage difference across the compensation capacitor 104).

In summary explanation, a slew rate boosting scheme is implemented for amplifiers having a closed-loop gain that is equal to unity or close to unity. The scheme has one side of a compensation capacitor conventionally coupled to a high impedance gain node while the opposite side of the compensation capacitor is unconventionally driven with a buffered version of the input signal to the amplifier such that the voltage signal appearing across the compensation capacitor is significantly less than that achieved using conventional compensation architectures where the opposite side of the compensation capacitor is coupled to an AC ground. The value of the compensation capacitor is no longer a significant factor affecting the amplifier slew rate since the tail current generated by the input stage is no longer required to charge the compensation capacitor to achieve a voltage difference between the signal voltage and AC ground. The tail current is now available to charge any parasitic capacitance within the amplifier, therefore boosting its slew rate.

In view of the above, it can be seen the present invention presents a significant advancement in the art of slew rate boosting schemes for amplifiers having unity or nearly unity closed-loop gains. Further, this invention has been described in considerable detail in order to provide those skilled in the data communication art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, although various embodiments have been presented herein with reference to particular transistor types, the present inventive structures and characteristics are not necessarily limited to particular transistor types or sets of characteristics as used herein. It shall be understood the embodiments described herein above can easily be implemented using many diverse transistor types so long as the combinations achieve a slew rate boosting scheme for amplifiers having a closed-loop gain equal to or close to unity, according to the inventive principles set forth herein above.

What is claimed is:

1. A slew rate boosted amplifier comprising:
   an input stage having a high impedance gain node and further having a signal input, wherein the input stage is operative to generate a charging current in response to an input signal;
   a unity gain output buffer stage having a high input impedance and operational to generate an output signal in response to a signal at the high impedance gain node;
   a unity gain input buffer having a signal input connected to the signal input of the input stage and further having a signal output; and
   a compensation capacitor having one plate connected to the high impedance gain node and having its opposite plate connected to the unity gain input buffer signal output, and wherein the amplifier is configured to have a unity closed-loop gain such that a signal received at the input stage signal input and the unity gain input buffer signal input appears at each capacitor plate such that substantially none of the charging current generated by the input stage is required to charge the compensation capacitor in response to the input signal received by the input stage.

2. The slew rate boosted amplifier according to claim 1 wherein the slew rate boosted amplifier is an operational amplifier.

3. The slew rate boosted amplifier according to claim 1 wherein the unity gain output buffer stage is a class 'AB' buffer.

4. The slew rate boosted amplifier according to claim 1 wherein the unity gain input buffer is a class 'AB' buffer.

5. A slew rate boosted amplifier comprising:
   an input stage having a high impedance gain node and further having a signal input and operative to generate a charging current in response to an input signal;
   a unity gain output buffer stage having a high input impedance, wherein the unity gain output buffer is operational to generate an output signal in response to a signal at the high impedance gain node;
   a unity gain input buffer having a signal input and a signal output; and
   a compensation capacitor having one plate connected to the high impedance gain node and having its opposite plate connected to the unity gain input buffer signal output, and wherein the amplifier is configured to have a closed-loop gain near unity such that a signal received simultaneously at the input stage signal input and the unity gain input buffer signal input appears at each capacitor plate such that substantially all of the charging current generated by the input stage is available to charge parasitic capacitance associated with the unity gain output buffer stage.

6. The slew rate boosted amplifier according to claim 5 wherein the slew rate boosted amplifier is an operational amplifier.

7. The slew rate boosted amplifier according to claim 5 wherein the unity gain output buffer stage is a class 'AB' buffer.

8. The slew rate boosted amplifier according to claim 5 wherein the unity gain input buffer is a class 'AB' buffer.

9. A method of boosting an amplifier slew rate comprising the steps of:

(a) providing an operational amplifier (op-amp) having substantially a unity closed-loop gain;
   (b) providing a unity gain buffer;
   (c) communicating an input signal to the op-amp and the unity gain buffer such that the op-amp can generate a gain signal substantially identical to the input signal at an internal high impedance node and further such that the buffer can generate an output signal substantially identical to the input signal; and
   (d) connecting one plate of a compensation capacitor to the high impedance node and the opposite plate of the compensation capacitor to the buffer output signal such that each plate of the compensation capacitor will see a substantially identical voltage level change in response to changes in the input signal.

* * * * *